(12) United States Patent
Pfefferlein

(10) Patent No.: US 10,849,255 B2
(45) Date of Patent: Nov. 24, 2020

(54) COOLING APPARATUS

(71) Applicant: SIEMENS AKTIENGESELLSCHAFT, Munich (DE)

(72) Inventor: Stefan Pfefferlein, Heroldsberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/607,595

(22) PCT Filed: Apr. 11, 2018

(86) PCT No.: PCT/EP2018/059247
§ 371 (c)(1),
(2) Date: Oct. 23, 2019

(87) PCT Pub. No.: WO2018/197210
PCT Pub. Date: Nov. 1, 2018

(65) Prior Publication Data
US 2020/0305302 A1 Sep. 24, 2020

(30) Foreign Application Priority Data
Apr. 28, 2017 (EP) .................................. 17000739

(51) Int. Cl.
*H05K 7/20* (2006.01)
*F28D 7/10* (2006.01)
*F04D 29/58* (2006.01)

(52) U.S. Cl.
CPC .......... *H05K 7/209* (2013.01); *F04D 29/586* (2013.01); *F04D 29/5806* (2013.01); *F28D 7/10* (2013.01);
(Continued)

(58) Field of Classification Search
CPC ...... F04D 29/5806; F04D 29/586; F28D 7/10; H05K 7/20154; H05K 7/20163;
(Continued)

(56) References Cited

U.S. PATENT DOCUMENTS 6,408,937 B1  6/2002  Roy
2010/0143153 A1* 6/2010  Gross ..................... F01D 5/187
                                              416/97 R
(Continued)

FOREIGN PATENT DOCUMENTS

EP       1343362 A1     9/2003

OTHER PUBLICATIONS

PCT International Preliminary Examination report of International Examination Authority dated Jul. 3, 2019 corresponding to PCT International Application No. PCT/EP2018/059247 filed Nov. 4, 2018.

*Primary Examiner* — Jacob R Crum
(74) *Attorney, Agent, or Firm* — Henry M. Feiereisen LLC

(57) ABSTRACT

A cooling apparatus for cooling an electronic component includes a heat sink, a heat sink cover to close a top area opening of the heat sink, a tube-shaped cooling element arranged inside the heat sink for some cooling ribs of the heat sink in mechanical contact with an outer side of the tube-shaped cooling element, and an impeller with blades for generating a cooling flow of a cooling medium. The tube-shaped cooling element forms a first cooling duct to conduct the cooling flow in a first cooling flow direction. A second cooling duct opposite the first cooling duct is formed between an inner area of the heat sink and the outer side of the tube-shaped cooling element to conduct the cooling flow (Continued)

in a second cooling flow direction. The cooling flow is redirected from the first cooling duct to the second cooling duct or vice versa.

22 Claims, 4 Drawing Sheets

(52) U.S. Cl.
CPC ..... *H05K 7/20154* (2013.01); *H05K 7/20163* (2013.01); *H05K 7/20263* (2013.01); *H05K 7/20272* (2013.01); *H05K 7/20927* (2013.01)

(58) Field of Classification Search
CPC ........... H05K 7/20263; H05K 7/20272; H05K 7/20554; H05K 7/206; H05K 7/209; H05K 7/20927
See application file for complete search history.

(56) References Cited

U.S. PATENT DOCUMENTS

| | | | |
|---|---|---|---|
| 2014/0328684 A1* | 11/2014 | King | F04D 29/584 |
| | | | 416/95 |
| 2015/0000882 A1 | 1/2015 | Yang | |
| 2015/0013953 A1 | 1/2015 | Mandelberg et al. | |
| 2017/0163125 A1* | 6/2017 | Granat | H02K 1/32 |
| 2018/0231006 A1* | 8/2018 | Sun | F04D 17/122 |
| 2018/0352685 A1* | 12/2018 | Wan | H05K 7/20154 |
| 2019/0063462 A1* | 2/2019 | Winkler | F04D 29/026 |
| 2020/0166281 A1* | 5/2020 | Oono | F28F 1/40 |

* cited by examiner

COOLING APPARATUS

CROSS-REFERENCES TO RELATED APPLICATIONS

This application is the U.S. National Stage of International Application No. PCT/EP2018/059247, filed Apr. 11, 2018, which designated the United States and has been published as International Publication No. WO 2018/197210 A1 and which claims the priority of European Patent Application, Serial No. 17000739.7, filed Apr. 28, 2017, pursuant to 35 U.S.C. 119(a)-(d).

BACKGROUND OF THE INVENTION

The invention relates to a cooling apparatus for cooling at least one electronic component. The invention further relates to an electrical converter with the cooling apparatus according to the invention.

Equally whether for the field of energy supply, for the industrial automation and drive technology sector or for use in electric vehicles, high requirements are placed on electrical converters, for example on their dynamic provision of energy in all power classes associated with a low power loss, a provision of small, space-saving installation sizes and an operability required for decentralized applications, even using suitable modular parts which moreover enable cost-effective manufacturing methods.

Concepts and the technical implementation thereof with regard to an efficient heat dissipation of electronic or electrotechnical components in electrical converters, such as the heat dissipation of power semiconductors, power resistors or also power capacitors for example, are able to address the indicated surrounding requirements accordingly and improve at least some of the addressed requirements from a holistic point of view.

In electrical converters for decentralized drive units for example, which are closely mechanically connected to the electric machine or even directly integrated in the housing of the electric machine, the efficient heat dissipation of the electronic or electrotechnical components is assigned particular importance in relation to utilizing installation locations which are predefined, have tight spatial dimensions and are unfavorable from thermal perspectives.

This applies all the more to the cited example, as here the spatial proximity to a heat source external to the converter, i.e. the electric machine, is to be taken into consideration.

A correspondingly dimensioned and centrally arranged heat sink of the electrical converter can carry out the heat dissipation of the electrical or electrotechnical components generating heat losses during operation.

Preferably, heat sinks of this kind are designed with a low aspect ratio of their length to width or their length to diameter. This results from a desired utilization of the extent of the structure of the heat sink while simultaneously achieving as small as possible an installation space of the heat sink as a part of the electrical converter.

In order that, with a rather short length of the heat sink during operation of the electrical converter, sufficient heat losses can be dissipated from the electronic or electrical parts mechanically connected to the heat sink, the surface structure of the heat sink is to be designed to be as large as possible.

As a result, however, the pressure loss of a cooling medium on or in the heat sink is also increased, which in turn implies an increase in or establishment of activities for the intensified heat dissipation of the heat sink itself. In general, this results in an additional or increased space requirement for the solutions by means of often forced heat dissipation of the heat sink, such as the use of fans for example. This solution is often associated with the increasing of the volume and likewise, at higher powers for the inherent requirements of the fans, with a reduction in the efficiency of the electrical converter.

A further problem of mostly air-cooled standard cooling systems is found in a cooling area of the heat sink which is lost for the heat dissipation, because two openings on two usually opposing heat sink sides of the heat sink for an intake and emission of the air, which flows through the heat sink interior of the heat sink in this solution, also take up two heat sink areas.

Furthermore, the air flow must be able to enter and exit in as unobstructed a manner as possible, i.e. In an advantageous manner from a flow perspective. As a result, the installation space upstream and downstream of the air intake and the air emission openings are only able to be used to a limited extent for the arrangement of further parts in the electrical converter. The described aspects lead to a loss in integration density and to rather inadequate utilization of the installation space in the electrical converter taken into consideration by way of example.

The invention is based on the object of providing a cooling apparatus, which unlike the prior art has an improvement in the use of installation space while simultaneously expanding cooling areas for the heat dissipation of electronic components in electrical or electrotechnical devices.

SUMMARY OF THE INVENTION

The object is achieved by a cooling apparatus as set forth hereinafter. Furthermore, the object is achieved by an electrical converter having the cooling apparatus according to the invention.

The invention is based on the knowledge that in particular an improved guiding of the cooling flow of a cooling medium is able to bring about, both by the skillful arrangement of the cooling inlets and outlets of the heat sink, as well as the skillful arrangement of the cooling ducts in the interior thereof, a significant enlargement of the available cooling area for cooling electronic components along the outer side of the heat sink.

It is therefore appropriate to not only provide an improved usage of the available installation space for a cooling apparatus, but also to modify the arrangements of all parts in electrical devices, for example in electrical converters, with regard to their compactness, robustness and performance capability.

To achieve the object, a cooling apparatus for cooling at least one electronic component is proposed, which comprises a heat sink, which has an outer peripheral area, a base area opening, a top area opening opposite the base area opening and an inner area with cooling ribs, which comprises a heat sink cover, which comprises a tube-shaped cooling element and which comprises an impeller with blades for generating a cooling flow of a cooling medium, wherein the top area opening is closed off by the heat sink cover, wherein the tube-shaped cooling element is arranged in the heat sink interior of the heat sink such that at least some of the cooling ribs are in mechanical contact with the outer side of the tube-shaped cooling element, wherein the tube-shaped cooling element, in its interior, forms a first cooling duct, through which during operation of the cooling apparatus the cooling flow is conducted in a first cooling flow direction, wherein a second cooling duct is formed between the inner area of the heat sink and the outer side of the tube-shaped cooling element, through which during operation of the cooling apparatus the cooling flow is conducted in a second cooling flow direction, wherein a redirecting means redirects the cooling flow from the first cooling duct to the second cooling duct or from the second cooling duct to the first cooling duct during operation and wherein the first cooling duct is arranged in relation to the second cooling duct such that the first cooling flow direction is substantially opposite the second cooling flow direction.

The guiding of the cooling flow through the first and the second cooling duct by means of the redirection within the cooling apparatus, which is proposed by the cooling apparatus according to the invention, enables an arrangement for an inlet and outlet of the cooling medium at only one of the outer areas of the heat sink.

In this context, the heat sink may also be embodied such that an inlet and outlet of the cooling medium is situated at the top area opening instead of at the base area opening; the construction of the cooling apparatus is then to be viewed in the reverse manner.

Therefore, it is particularly advantageous to arrange the first cooling duct approximately in parallel with the second cooling duct, which during operation of the cooling apparatus can preferably run the cooling flows of the cooling medium past one another in opposing directions. The spatial separation of the two cooling ducts running past one another significantly prevents a mixing in terms of flow of the cooling medium received from the outside with the cooling medium to be emitted outwards.

The impeller arranged inside the cooling apparatus, in addition to its function as a conveyor of the cooling medium, can also bring about a compression of the cooling medium. In this context, depending on the type of application, both radial impellers and axial impellers may be provided.

The compression of the cooling medium advantageously overcomes a possible pressure loss, which may occur during operation, possibly in spatially larger cooling apparatuses with long cooling paths compared to cooling systems which differ therefrom. The use of the impeller substantially as a conveyor or as a combination of conveying and compressing the cooling medium is determined, inter alia, by the geometric construction and the arrangement of its blades on its impeller shaft.

In this context, the cooling ribs provided for the invention enclose a full bandwidth of comparable protrusions and/or indentations on the heat sink which are used for heat dissipation, which may for example be cooling fins or cooling pins (also known as pin-fin heat sink).

The manner in which the tube-shaped cooling element is received by the cooling ribs arranged on the inner area of the heat sink enables a preferred central arrangement of the tube-shaped cooling element in the heat sink interior, arranged in the longitudinal direction between base area opening and top area opening of the heat sink.

The second cooling duct, which is formed between the inner area of the heat sink and the outer side of the tube-shaped cooling element, may be divided by the cooling ribs arranged in the second cooling duct along the cooling flow and in the longitudinal direction between the base area opening and the top area opening. The second cooling duct then has a plurality of partial cooling ducts, which may be isolated from one another such that there is no provision during operation of the cooling apparatus for mixing of the cooling medium between the partial cooling ducts, which are adjacent and isolated in this manner, in the second cooling duct.

During operation of the cooling apparatus, the cooling flow is then, for example, received at the base area opening, conducted through the first cooling duct with the first cooling flow direction, redirected by the redirecting means, conducted through the second cooling duct in the second cooling flow direction after the heat loss is received by the cooling ribs arranged in the second cooling duct and emitted once more via the base area opening.

An inverse guiding of the cooling flow, however, is advantageously likewise able to be performed. A reversing of the guiding of the cooling flow can thus take place during operation of the cooling apparatus depending on the application case.

Advantageous embodiments of the energy supply system are disclosed in the dependent claims.

In a first advantageous embodiment of the cooling apparatus according to the invention, a depression of the heat sink cover facing towards the heat sink interior is embodied such that it partially or completely surrounds the peripheral extent of the rotation body forming during operation of the cooling apparatus by way of the rotating blades of the impeller.

In particular, by way of the blades of the impeller being completely received in the heat sink cover, wherein during the rotating operation of the impeller the size ratios of the blades are determined by the peripheral extent of the rotation body being formed, the heat sink interior of the heat sink with the tube-shaped cooling element can advantageously be dimensioned differently depending on the application case, without an adaptation to the impeller, i.e. substantially to the shape and size of the blades, having to take place.

In a further advantageous embodiment of the cooling apparatus according to the invention, an indentation in the cooling ribs at the top area opening of the heat sink and a cooling element protrusion of the tube-shaped cooling element are embodied such that they partially or completely surround the peripheral extent of the rotation body forming during operation of the cooling apparatus by way of the rotating blades of the impeller.

In particular, by way of the blades of the impeller being completely received in the heat sink, the heat sink cover of the heat sink with the tube-shaped cooling element can advantageously be dimensioned differently depending on the application case, without an adaptation to the impeller, i.e. substantially to the shape and size of the blades, having to take place.

In a further advantageous embodiment of the cooling apparatus according to the invention, a depression of the heat sink cover facing towards the heat sink interior in an enclosure combination with an indentation in the cooling ribs in the heat sink interior at the top area opening of the heat sink and a cooling element protrusion of the tube-shaped cooling element are embodied such that it partially or completely surrounds the peripheral extent of the rotation body forming during operation of the cooling apparatus by way of the rotating blades of the impeller.

Including at least the impeller inside the cooling apparatus brings about an advantageous reduction of the running noise of the impeller during operation, in each of the shown embodiments. Such an encapsulation of the impeller also protects from mechanical damage and from excessive contamination from outside the cooling apparatus.

In a further advantageous embodiment of the cooling apparatus according to the invention, the redirecting means has a rounded-off area in the depression of the heat sink cover facing towards the heat sink interior and, by means of the rounded-off area, the cooling flow is substantially redirected during operation of the cooling apparatus.

This embodiment advantageously enables, based on a structural shaping of the rounded-off area in the heat sink cover, a solution, which is simple to plan and manufacture, for redirecting the cooling flow generated during operation of the cooling apparatus from the first cooling duct to the second cooling duct, or vice versa. By means of the rounded-off area in the heat sink cover as redirecting means, the impeller can for example be completely integrated in the heat sink interior, wherein it can then be designed for guiding the cooling flow alone, for example. A functionality is possible which simultaneously also compresses.

In a further advantageous embodiment of the cooling apparatus according to the invention, the redirecting means has the impeller and the cooling flow is substantially redirected by means of the impeller during operation of the cooling apparatus.

The impeller as redirecting means is structurally designed in this application case such that generally both the geometric design and arrangement of the blades of the impeller, as well as the interconnected blade edges which are facing towards the heat sink cover and form an end plate of the impeller, bring about the redirection of the cooling flow during operation of the cooling apparatus.

In a further advantageous embodiment of the cooling apparatus according to the invention, the redirecting means has a redirecting combination consisting of a rounded-off area in the depression of the heat sink cover facing towards the heat sink interior and the impeller and the cooling flow is substantially redirected by means of the redirecting combination during operation of the cooling apparatus.

The redirecting combination advantageously enables, for the structural embodiment of the redirecting means, a large number of embodiment possibilities for various application cases (e.g. in industry, energy supply and electric vehicles) when using the cooling apparatus, which not only relate to an improvement in the efficiency of the cooling apparatus, but also relate to an improvement in the spatial arrangement within the cooling apparatus and in relation to a further spatial arrangement of the cooling apparatus in a superstructure of an electrical device, for example of the one electrical converter.

In a further advantageous embodiment of the cooling apparatus according to the invention, the impeller is connected to a drive unit via its impeller shaft, the impeller is embodied such that during operation of the cooling apparatus it rotates with a first direction of rotation and with a second direction of rotation, the cooling flow is generated by means of the first direction of rotation such that the cooling medium is received at the base area opening, the cooling medium is conducted through the first cooling duct, the cooling medium is redirected by means of the redirecting means, the cooling medium is conducted through the second cooling duct and the cooling medium is emitted at the base area opening or cooling flow is generated by means of the second direction of rotation such that the cooling medium is received at the base area opening, the cooling medium is conducted through the second cooling duct, the cooling medium is redirected by means of the redirecting means, the cooling medium is conducted through the first cooling duct and the cooling medium is emitted at the base area opening.

With this embodiment, the cooling apparatus obtains further degrees of freedom for the use in electrical devices, for example in electrical converters. It is thus possible to conduct the cooling flow in the opposite direction during operation of the cooling apparatus, even when the cooling apparatus is fully loaded. One example would be the first cooling duct which, when applying the first direction of rotation of the impeller rotating during operation, by means of the cooling flow, receives the cooling medium at the base area opening and passes it on to the redirecting means. Once the second direction of rotation is applied, the direction of the cooling flow with the cooling medium reverses and emits the cooling medium arriving from the redirecting means via the base area opening towards the exterior of the cooling apparatus.

The mounting of the impeller shaft of the impeller can be mounted solely via a first bearing, which is arranged in a first bearing bracket on the heat sink cover. A second bearing, which is arranged in a second bearing bracket on or in the tube-shaped cooling element, may be provided as a counter bearing, but also as a further sole bearing, for the mounting of the impeller shaft of the impeller.

The impeller may further also be connected via its impeller shaft to the drive unit in such a way, for example directly to a drive shaft of an electric machine, that a mounting of the impeller shaft of the impeller on or in the cooling apparatus can be dispensed with.

Operating cases of this kind with a change in the direction of rotation of the impeller can then only be present if the cooling apparatus, in addition to the cooling function, at times is also to have a heating function. This may be necessary when used in cold regions, for example, where initially preheated cooling medium is needed as a kind of start-up aid to heat up electronic components for example and these later need to be cooled down again by means of the cooling medium.

In a further advantageous embodiment of the cooling apparatus according to the invention, a funnel element at the base area opening of the heat sink is mechanically connected to the heat sink and the tube-shaped cooling element, a first funnel element opening of the funnel element at the base area opening and at the first cooling duct is arranged such that the cooling flow of the cooling medium during operation of the cooling apparatus is conducted from the first cooling duct to the first funnel element opening or from the first funnel element opening to the first cooling duct, a second funnel element opening of the funnel element at the base area opening and at the second cooling duct is arranged such that the cooling flow of the cooling medium during operation of the cooling apparatus is conducted from the second cooling duct to the second funnel element opening or from the second funnel element opening to the first cooling duct and a funnel element wall inside the funnel element is embodied such that a mixing of the cooling flow in the funnel element, which is conducted through the first funnel element opening, with the cooling flow, which is conducted through the second funnel element opening, is prevented during operation of the cooling apparatus.

The embodiment with the funnel element accordingly advantageously prevents that the cooling medium, which has not yet been heated and for example is received through the first funnel element openings during operation of the cooling apparatus, is mixed with the heated cooling medium, which during operation of the cooling apparatus is accordingly emitted through the second funnel element openings, i.e. in this case is undesirably preheated.

In a further advantageous embodiment of the cooling apparatus according to the invention, the tube-shaped cooling element is formed from a plastic or a composite material containing a plastic.

Plastic can be manufactured as a composite material (spraying plastic onto other materials) in a comparatively cost-effective and simple manner. At its connection points to a further part, it has a broadly improved sealing functionality than metal alone, for example. Moreover, the thermal conductivity of plastic is also considerably smaller than that of metal, which satisfies the thermally insulating functionality of the tube-shaped cooling element which is usually desired.

In a further advantageous embodiment of the cooling apparatus according to the invention, the tube-shaped cooling element is embodied in a single-part or multi-part manner.

This embodiment, depending on the manufacturing technology and structural concept, can be particularly conducive to the use of the cooling apparatus with a modular construction. If the tube-shaped cooling element is embodied in one piece, then manufacture is often elaborate, although the installation in the cooling apparatus is performed rather quickly. Conversely, in the multi-part embodiment of the tube-shaped cooling element, the manufacturing of individual elements of the cooling apparatus is generally able to be carried out with little outlay, although the assembly of the individual parts mostly proves elaborate.

In a further advantageous embodiment of the cooling apparatus according to the invention, the multi-part tube-shaped cooling element has a guiding element, a spacer, a first coupling element, which is facing towards the top area opening, and a second coupling element, which is facing towards the base area opening.

In the multi-part embodiment of the tube-shaped cooling element, the guiding element assumes an advantageous integrating function. In this context, the spacer defines a precisely fitting introduction of the first and the second coupling element.

In a further advantageous embodiment of the cooling apparatus according to the invention, the cooling medium is gaseous or liquid.

Thus, the cooling apparatus is advantageously also able to be used for applications with liquid cooling.

In a further advantageous embodiment of the cooling apparatus according to the invention, the peripheral area and/or a cover area of the heat sink cover oriented towards the exterior are provided for mechanically and thermally connecting the heat sink to at least one electronic component and the at least one electronic component undergoes heat dissipation via this connection during operation of the cooling apparatus.

In particular, the use of the heat sink cover advantageously increases the area available for the heat dissipation of the at least one electronic component. Here, the at least one electronic component may also be arranged on the respective outer side of the heat sink and the heat sink cover in such a geometrically complex manner that substantially their entire area is used for the heat dissipation.

For achieving the object, there is likewise provision for an electrical converter with a cooling apparatus according to the invention for cooling at least one electronic component, wherein the electrical converter is able to be operated on an electrical network and the electrical converter, during operation, supplies electrical energy to an electric machine or a further electrical network.

BRIEF DESCRIPTION OF THE DRAWING

The above-described properties, features and advantages of this invention and the manner in which these are achieved become clearer and more readily comprehensible in conjunction with the following description of the exemplary embodiments, which are explained in more detail in conjunction with the drawings, in which.

DETAILED DESCRIPTION OF PREFERRED EMBODIMENTS

Figure 1:
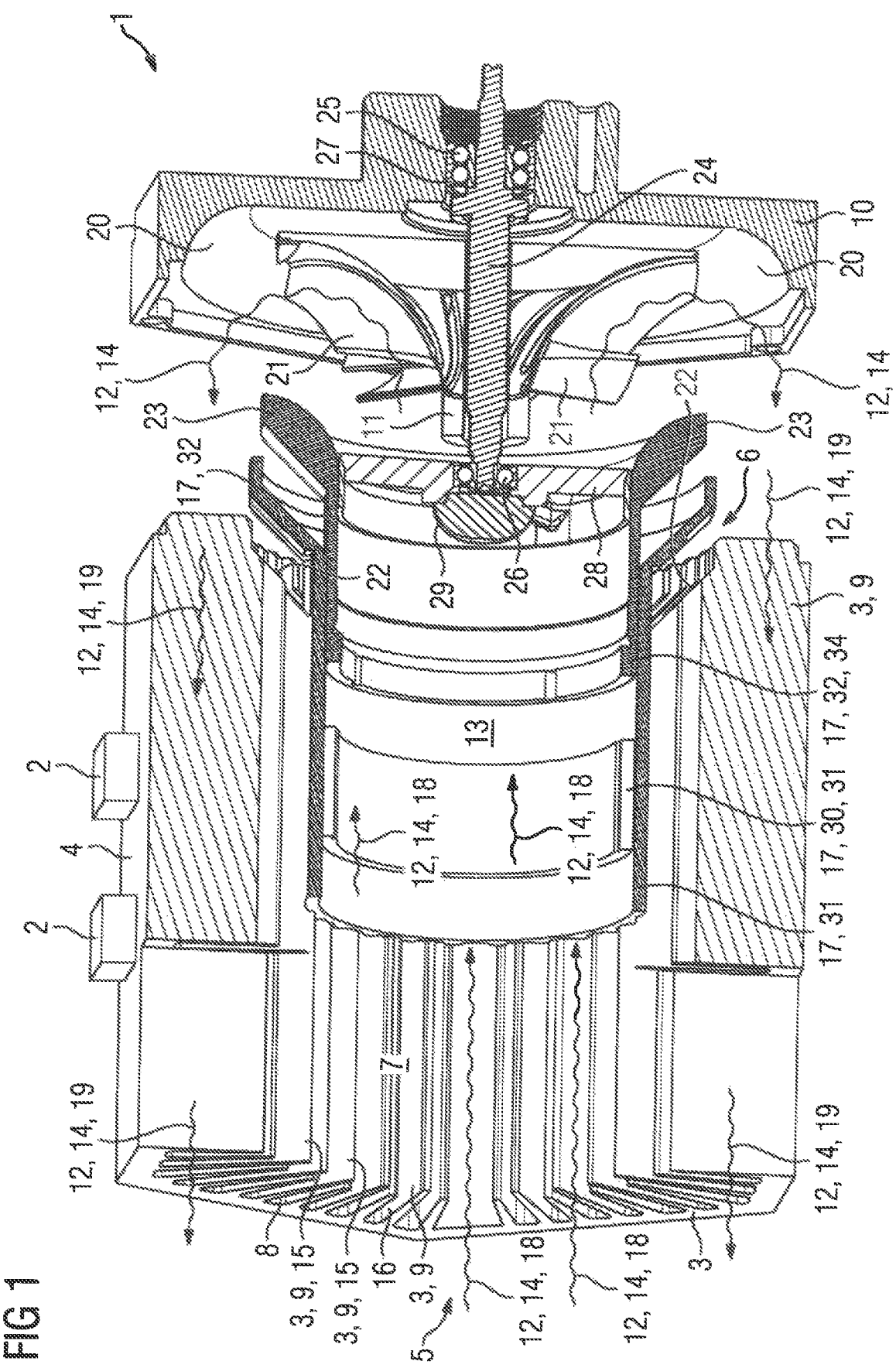
FIG. 1 shows a schematic cross-sectional representation of the cooling apparatus according to the invention.

In FIG. 1, a schematic cross-sectional representation of the cooling apparatus 1 according to the invention is shown, wherein cross-sectional representation is an exploded representation. In this figure, the cross-section is positioned over the entire length of the cooling apparatus 1, starting from the base area opening 5 of the heat sink 3, over the top area opening 6 of the heat sink 3, up to the heat sink cover 10.

Shown is a structural example of a cooling apparatus 1 according to the invention and a cooling flow 14 of a cooling medium 12 which ensues by way of example during operation of the cooling apparatus 1. The cooling flow 14 of the cooling medium 12 ensues in the exemplary embodiment by the impeller 11 rotating with a first direction of rotation.

The heat sink 3 of the cooling apparatus 1 has an outer peripheral area 4, a base area opening 5, a top area opening 6 opposite the base area opening 5 and an inner area 8 with cooling ribs 9. The cooling ribs 9 comprise cooling rib tips 15 on the end facing away from the inner area 8 of the heat sink 3.

A heat sink cover 10 closes off the heat sink 3 at the top area opening 6 of the heat sink 3 (the exploded view in FIG. 1 only shows this indirectly). To seal off said closure, a seal may be provided between the heat sink 3 and the heat sink cover 10 (not shown in FIG. 1).

Inside the cooling apparatus 1, the impeller 11 with its blades 21 for generating the cooling flow 14 of the cooling medium 12 is arranged at the top area opening 6. An enclosure combination of a depression of the heat sink cover 10 facing towards the heat sink interior 7, a cooling element protrusion 23 on a tube-shaped cooling element 17 in the heat sink interior 7 and an indentation 22 in the cooling ribs 9 of the heat sink 3 in the heat sink interior 7 is embodied at the top area opening 6 of the heat sink 3 such that the impeller 11 with its blades 21 as well as at least part of the impeller shaft 24 of the impeller 11 is surrounded by the enclosure combination.

The tube-shaped cooling element 17 is arranged in the heat sink interior 7 of the heat sink 3 such that at least some of the cooling ribs 9, in detail the cooling rib tips 15 thereof, are in mechanical contact with the outer side of the tube-shaped cooling element 17. In its interior, the tube-shaped cooling element 17 forms a first cooling duct 13, through which the cooling flow 14 is conducted here in a first cooling flow direction 18 during operation of the cooling apparatus 1 by the exemplary rotation of the impeller 11 in a first direction of rotation.

A second cooling duct 16 is formed between the inner area 8 of the heat sink 3 and the outer side of the tube-shaped cooling element 17, through which the cooling flow 14 is conducted in a second cooling flow direction 19 during operation of the cooling apparatus 1.

A redirecting means redirects the cooling flow 14 from the first cooling duct 13 to the second cooling duct 16, given the first direction of rotation of the rotating impeller 11 chosen by way of example, during operation of the cooling apparatus 1. In this context, the first cooling duct 13 is arranged opposite the second cooling duct 16 such that the first cooling flow direction 18 is substantially opposite the second cooling flow direction 19.

The redirecting means in FIG. 1 is a redirecting combination, which is formed by a rounded-off area 20 in the depression of the heat sink cover 10 facing towards the heat sink interior 7 and by the impeller 11. By means of the redirecting combination, the cooling flow 14 is substantially redirected as described during operation of the cooling apparatus 1.

Likewise shown in FIG. 1 is a multi-part embodiment of the tube-shaped cooling element 17, which has a guiding element 31, a spacer 30, a first coupling element 32, which is facing towards the top area opening 6, and a second coupling element (not shown in FIG. 1), which is facing towards the base area opening 5.

A border groove 34 is arranged at the end facing away from the cooling element protrusion 23, inside the first coupling element 32 of the tube-shaped cooling element 17. This boundary groove 34 secures and connects a second bearing bracket 28 to the first coupling element 32 mechanically. The second bearing bracket 28 holds the second bearing 26, for example as a counter bearing of the impeller shaft 24 of the impeller 11. To protect the second bearing 26 from contamination and damage from outside the cooling apparatus 1, a bearing covering 29 is arranged facing towards the base area opening 5.

The impeller shaft 24 of the impeller 11 is further mounted by means of a first bearing 25, which is held by a first bearing bracket 27 arranged on the heat sink cover 10.

On the peripheral area 4, two electronic components 2 are mechanically connected to the heat sink 3 by way of example in FIG. 1, wherein the electronic components 2 are able to undergo heat dissipation by means of said mechanical connection during operation of the cooling apparatus 1. The outer area of the heat sink cover 10 may also be used for the heat dissipation of further electronic components (not shown in FIG. 1).

Figure 2:
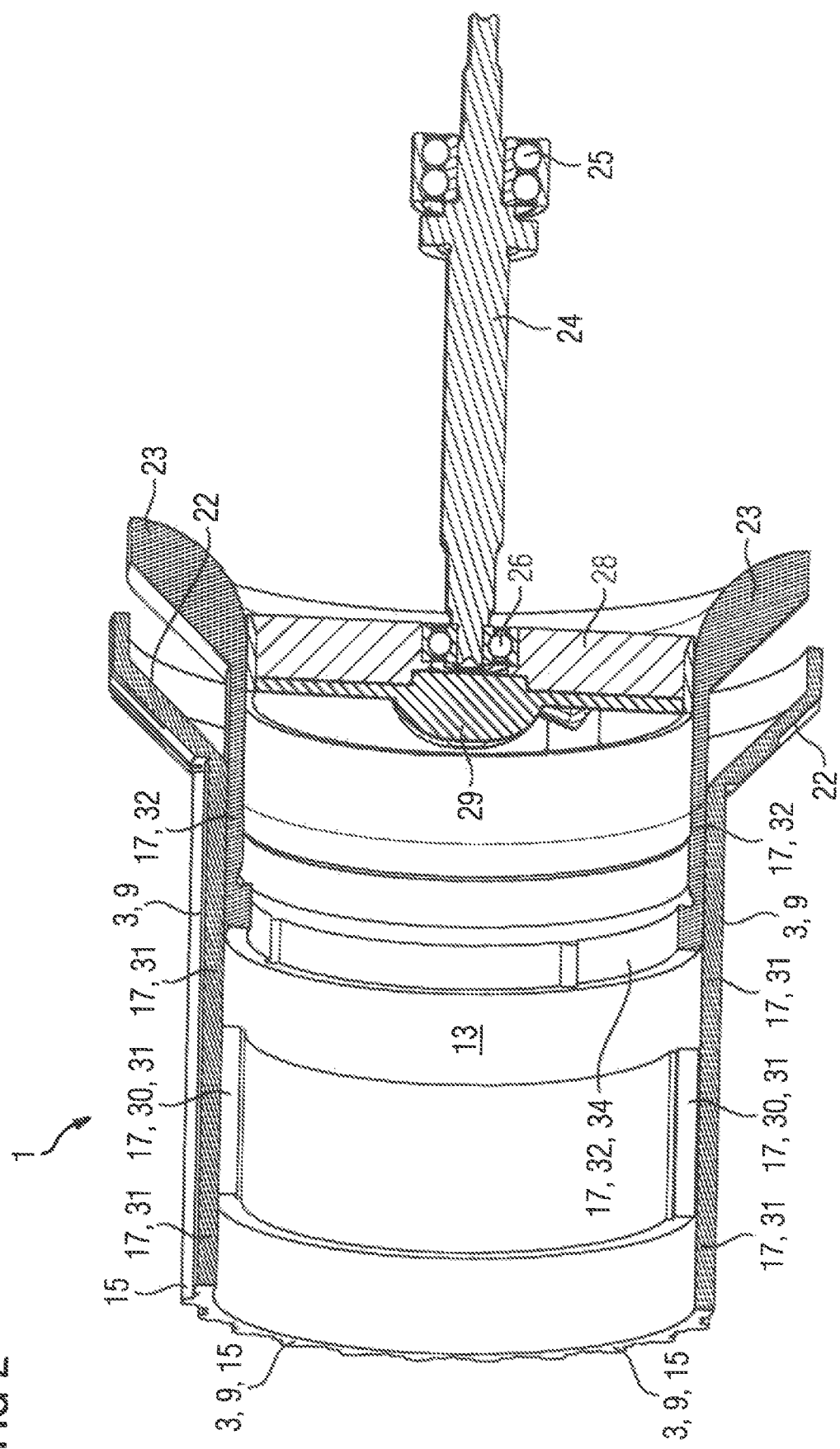
FIG. 2 shows a detailed representation of the schematic cross-sectional representation of the cooling apparatus according to the invention of FIG. 1.

FIG. 2 shows a detailed representation of the schematic cross-sectional representation of the cooling apparatus according to the invention of FIG. 1. Here, the tube-shaped cooling element 17 is shown in particular, which forms the first cooling duct 13 and, as already described, is designed in a multi-part manner (the second coupling element is not shown in FIG. 2). Furthermore, the mounting of the impeller shaft 24 of the impeller 11 is likewise shown in a comparable manner to in FIG. 1 and the description thereof.

Figure 3:
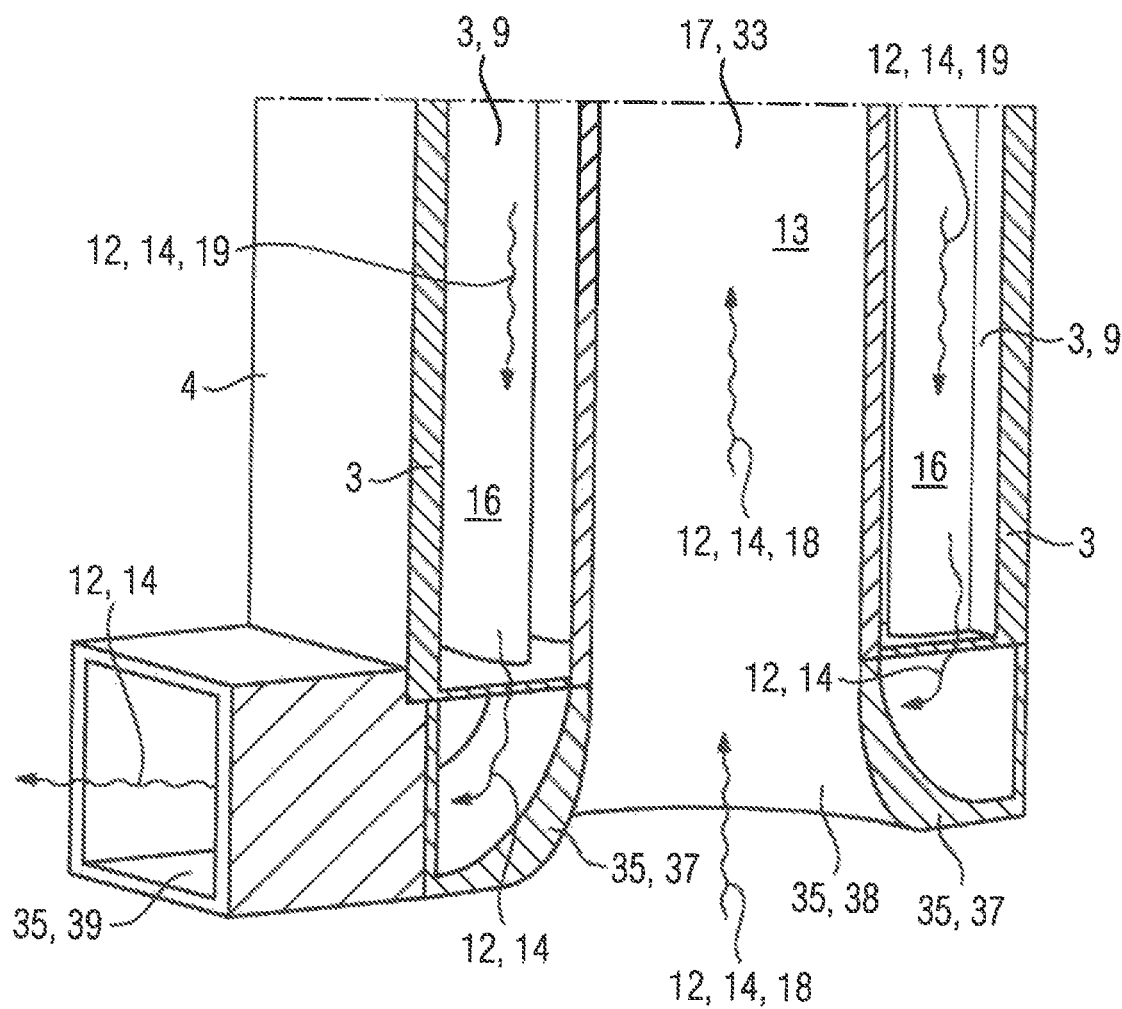
FIG. 3 shows a further schematic cross-sectional representation of a funnel element with a first and a second funnel element opening arranged on the heat sink of the cooling apparatus according to the invention of FIG. 1

FIG. 3 shows a further schematic cross-sectional representation of a funnel element 35 with a first and a second funnel element opening 38, 39, which are arranged on the heat sink 3 of the cooling apparatus 1 according to the invention of FIG. 1.

The funnel element 35 is mechanically connected to the heat sink 3 and to the tube-shaped cooling element 17 at the base area opening (not shown in FIG. 3, but comparable to the base area opening 5 in FIG. 1) of the heat sink 3. The tube-shaped cooling element 17 shown is embodied in a multi-part manner. Therefore, a second coupling element 33 of the tube-shaped cooling element 17 can be seen in FIG. 3.

A first funnel element opening 38 of the funnel element 35 is arranged at the base area opening of the heat sink 3 and at the first cooling duct 13. By way of example, the cooling flow 14 of the cooling medium 12 is conducted from the first funnel element opening 38 to the first cooling duct 13 during operation of the cooling apparatus 1. A second funnel element opening 39 of the funnel element 35 is arranged at the base area opening of the heat sink 3 and at the second cooling duct 16. According to the aforementioned example, the cooling flow 14 of the cooling medium 12 is conducted from the second cooling duct 16 to the second funnel element opening 39 during operation of the cooling apparatus 1.

A funnel element wall 37 inside the funnel element 35 is embodied such that a mixing of the cooling flow 14 in the funnel element 35, which is conducted through the first funnel element opening 38, with the cooling flow 14, which is conducted through the second funnel element opening 39, is prevented during operation of the cooling apparatus 1.

Starting from the direction of the cooling flow 14 chosen by way of example here in FIG. 3, it is advantageous, in particular for the receiving of the cooling medium 12 by the cooling flow 14 at the first funnel element opening 38 shown here, a geometric shape of a trumpet head which curves outward is to be chosen for the funnel element 35. By way of this geometric shape of the trumpet head, favorable flow relationships are formed at this point when the cooling medium 12 is received by means of the cooling flow 14 at the first funnel element opening 38 during operation of the cooling apparatus 1.

Figure 4:
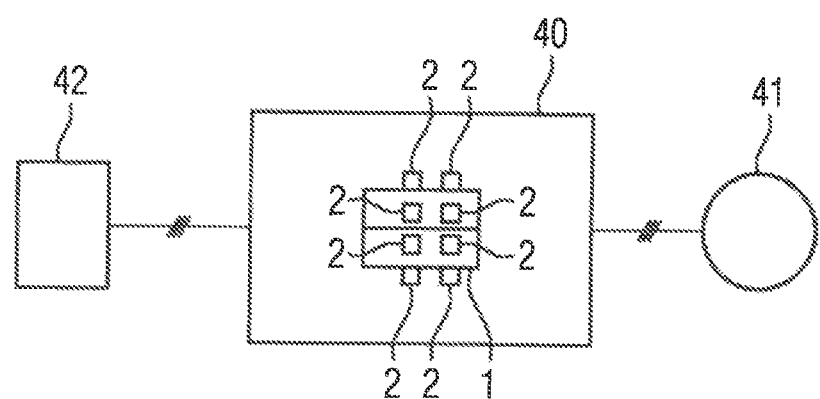
FIG. 4 shows a schematic representation of an electrical converter on the electrical network with the cooling apparatus according to the invention.

A schematic representation of an electrical converter 40 on the electrical network 42 with the cooling apparatus 1 according to the invention is shown by FIG. 4.

The electrical converter 40 has the cooling apparatus 1 together with, by way of example, six electronic components 2 to undergo heat dissipation and is able to be operated using electrical energy by means of a three-phase electrical line from the electrical network 42. An electric machine 41 is able to be operated by the electrical converter 40 by means of a three-phase electric line. Not shown in FIG. 4 is the option of supplying electrical energy to a further electrical network by means of the electrical converter 40.

What is claimed is:

1. A cooling apparatus for cooling an electronic component, said cooling apparatus comprising:
a heat sink including an outer peripheral area, a base area opening, a top area opening opposite the base area opening, and cooling ribs on an inner area of the heat sink;
a heat sink cover configured to close off the top area opening of the heat sink, said heat sink cover having a depression which faces towards an interior of the heat sink;
a tube-shaped cooling element arranged in the interior of the heat sink such that at least some of the cooling ribs are in mechanical contact with an outer side of the tube-shaped cooling element, said tube-shaped cooling element being configured to form in its interior a first cooling duct for conduction of a cooling flow of a cooling medium in a first cooling flow direction during operation of the cooling apparatus, with a second cooling duct being formed between the inner area of the heat sink and the outer side of the tube-shaped cooling element for conduction of the cooling flow in a second cooling flow direction during operation of the cooling apparatus, and with the first cooling duct being arranged opposite the second cooling duct such that the first cooling flow direction is substantially opposite the second cooling flow direction;

an impeller including blades for generating the cooling flow of the cooling medium, said blades when rotating during operation of the cooling apparatus forming a rotation body having a peripheral extent which is partially or completely surrounded by the depression of the heat sink cover; and a redirecting means configured to redirect the cooling flow from the first cooling duct to the second cooling duct or from the second cooling duct to the first cooling duct during operation of the cooling apparatus.

2. The cooling apparatus of claim 1, wherein the redirecting means is formed by a rounded-off area in the depression of the cooling body cover to substantially redirect the cooling flow during operation of the cooling apparatus.

3. The cooling apparatus of claim 1, wherein the redirecting means is formed by the impeller to substantially redirect the cooling flow during operation of the cooling apparatus.

4. The cooling apparatus of claim 1, wherein the redirecting means is formed by a redirecting combination comprised of a rounded-off area in the depression of the cooling body cover and the impeller, to substantially redirect the cooling flow during operation of the cooling apparatus.

5. The cooling apparatus of claim 1, wherein the impeller includes an impeller shaft for connection to a drive unit and is configured for rotation in a first direction of rotation in which the cooling flow is generated such that the cooling medium is received at the base area opening, the cooling medium is conducted through the first cooling duct, the cooling medium is redirected by the redirecting means, the cooling medium is conducted through the second cooling duct, and the cooling medium is emitted at the base area opening, and for rotation in a second direction of rotation in which the cooling flow is generated such that the cooling medium is received at the base area opening, the cooling medium is conducted through the second cooling duct, the cooling medium is redirected by the redirecting means, the cooling medium is conducted through the first cooling duct, and the cooling medium is emitted at the base area opening.

6. The cooling apparatus of claim 1, further comprising a funnel element mechanically connected to the heat sink and the tube-shaped cooling element at the base area opening of the heat sink, said funnel element including a first funnel element opening arranged at the base area opening and at the first cooling duct such that the cooling flow of the cooling medium is conducted from the first cooling duct to the first funnel element opening or from the first funnel element opening to the first cooling duct during operation of the cooling apparatus, a second funnel element opening arranged at the base area opening and at the second cooling duct such that the cooling flow of the cooling medium is conducted from the second cooling duct to the second funnel element opening or from the second funnel element opening to the first cooling duct during operation of the cooling apparatus, and an inner funnel element wall configured to prevent a mixing in the funnel element of the cooling flow conducted through the first funnel element opening with the cooling flow conducted through the second funnel element opening.

7. The cooling apparatus of claim 1, wherein the tube-shaped cooling element is formed from a plastic or a composite material containing a plastic.

8. The cooling apparatus of claim 1, wherein the tube-shaped cooling element is embodied in a single-part manner.

9. The cooling apparatus of claim 1, wherein the tube-shaped cooling element is embodied in a multi-part manner comprised of a guiding element, a spacer, a first coupling element facing towards the top area opening, and a second coupling element facing towards the base area opening.

10. The cooling apparatus of claim 1, wherein the cooling medium is gaseous or liquid.

11. The cooling apparatus of claim 1, wherein the peripheral area and/or a cover area of the heat sink cover oriented towards an exterior mechanically and thermally connect the heat sink to the electronic component to thereby dissipate heat from the electronic component during operation of the cooling apparatus.

12. An electrical converter, comprising a cooling apparatus for cooling an electronic component, said cooling apparatus comprising a heat sink including an outer peripheral area, a base area opening, a top area opening opposite the base area opening, and cooling ribs on an inner area of the heat sink, a heat sink cover configured to close off the top area opening of the heat sink, said heat sink cover having a depression which faces towards an interior of the heat sink, a tube-shaped cooling element arranged in the interior of the heat sink such that at least some of the cooling ribs are in mechanical contact with an outer side of the tube-shaped cooling element, said tube-shaped cooling element being configured to form in its interior a first cooling duct for conduction of a cooling flow of a cooling medium in a first cooling flow direction during operation of the cooling apparatus, with a second cooling duct being formed between the inner area of the heat sink and the outer side of the tube-shaped cooling element for conduction of the cooling flow in a second cooling flow direction during operation of the cooling apparatus, and with the first cooling duct being arranged opposite the second cooling duct such that the first cooling flow direction is substantially opposite the second cooling flow direction, an impeller including blades for generating the cooling flow of the cooling medium, said blades when rotating during operation of the cooling apparatus forming a rotation body having a peripheral extent which is partially or completely surrounded by the depression of the heat sink cover, and a redirecting means configured to redirect the cooling flow from the first cooling duct to the second cooling duct or from the second cooling duct to the first cooling duct during operation of the cooling apparatus, wherein the electrical converter is operated from an electrical network and capable of supplying electrical energy to an electric machine or a further electrical network during operation.

13. The electric converter of claim 12, wherein the redirecting means is formed by a rounded-off area in the depression of the cooling body cover to substantially redirect the cooling flow during operation of the cooling apparatus.

14. The electric converter of claim 12, wherein the redirecting means is formed by the impeller to substantially redirect the cooling flow during operation of the cooling apparatus.

15. The electric converter of claim 12, wherein the redirecting means is formed by a redirecting combination comprised of a rounded-off area in the depression of the cooling body cover and the impeller, to substantially redirect the cooling flow during operation of the cooling apparatus.

16. The electric converter of claim 12, wherein the impeller includes an Impeller shaft for connection to a drive unit and is configured for rotation in a first direction of rotation in which the cooling flow is generated such that the cooling medium is received at the base area opening, the cooling medium is conducted through the first cooling duct, the cooling medium is redirected by the redirecting means, the cooling medium is conducted through the second cooling duct, and the cooling medium is emitted at the base area opening, and for rotation in a second direction of rotation in which the cooling flow is generated such that the cooling medium is received at the base area opening, the cooling medium is conducted through the second cooling duct, the cooling medium is redirected by the redirecting means, the cooling medium is conducted through the first cooling duct, and the cooling medium is emitted at the base area opening.

17. The electric converter of claim 12, wherein the cooling apparatus includes a funnel element mechanically connected to the heat sink and the tube-shaped cooling element at the base area opening of the heat sink, said funnel element including a first funnel element opening arranged at the base area opening and at the first cooling duct such that the cooling flow of the cooling medium is conducted from the first cooling duct to the first funnel element opening or from the first funnel element opening to the first cooling duct during operation of the cooling apparatus, a second funnel element opening arranged at the base area opening and at the second cooling duct such that the cooling flow of the cooling medium is conducted from the second cooling duct to the second funnel element opening or from the second funnel element opening to the first cooling duct during operation of the cooling apparatus, and an inner funnel element wall configured to prevent a mixing in the funnel element of the cooling flow conducted through the first funnel element opening with the cooling flow conducted through the second funnel element opening.

18. The electric converter of claim 12, wherein the tube-shaped cooling element is formed from a plastic or a composite material containing a plastic.

19. The electric converter of claim 12, wherein the tube-shaped cooling element is embodied in a single-part manner.

20. The electric converter of claim 12, wherein the tube-shaped cooling element is embodied in a multi-part manner comprised of a guiding element, a spacer, a first coupling element facing towards the top area opening, and a second coupling element facing towards the base area opening.

21. The electric converter of claim 12, wherein the cooling medium is gaseous or liquid.

22. The electric converter of claim 12, wherein the peripheral area and/or a cover area of the heat sink cover oriented towards an exterior mechanically and thermally connect the heat sink to the electronic component to thereby dissipate heat from the electronic component during operation of the cooling apparatus.

* * * * *